US007221626B2

United States Patent
Yabuki et al.

(10) Patent No.: US 7,221,626 B2
(45) Date of Patent: May 22, 2007

(54) MAGNETO-OPTICAL HEAD AND MAGNETO-OPTICAL STORAGE DEVICE

(75) Inventors: Akihiko Yabuki, Kawasaki (JP); Mamoru Hokari, Kawasaki (JP); Shigeru Akema, Kawasaki (JP); Ayu Miyakawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 671 days.

(21) Appl. No.: 10/761,167

(22) Filed: Jan. 20, 2004

(65) Prior Publication Data

US 2004/0151080 A1 Aug. 5, 2004

(30) Foreign Application Priority Data

Jan. 23, 2003 (JP) ............................. 2003-015211

(51) Int. Cl.
*G11B 11/00* (2006.01)
(52) U.S. Cl. ................................ 369/13.17; 369/13.23
(58) Field of Classification Search ............ 369/13.17, 369/13.2, 13.18, 13.22, 13.23, 44.14, 112.01, 369/53.11, 44.15, 44.18, 44.21, 44.22, 13.32
See application file for complete search history.

(56) References Cited

U.S. PATENT DOCUMENTS 5,305,294 A * 4/1994 Kime et al. ............... 369/13.17
5,404,342 A * 4/1995 Ohmori .................... 369/13.17
2006/0239138 A1* 10/2006 Shibano et al. .......... 369/44.14

FOREIGN PATENT DOCUMENTS

| JP | 11-250402 A | 9/1999 |
|---|---|---|
| JP | 2000-123435 A | 4/2000 |
| JP | 2000-207797 A | 7/2000 |
| JP | 2001-035039 A | 2/2001 |
| JP | 2002-230860 A | 8/2002 |
| JP | 2002-141792 A | 5/2003 |
| JP | 2003-346393 A | 12/2003 |

\* cited by examiner

*Primary Examiner*—Ali Neyzari
(74) *Attorney, Agent, or Firm*—Greer, Burns & Crain, Ltd.

(57) ABSTRACT

A magneto-optical head including a transparent substrate, a coil formed on a first surface of the transparent substrate, a pair of first electrodes formed on a side surface of the transparent substrate so as to be connected to a first end and a second end of the coil, respectively, and an objective lens unit bonded to a second surface of the transparent substrate. The magneto-optical head further includes a flexible printed circuit sheet bonded to the second surface of the transparent substrate, the flexible printed circuit sheet having an opening for insertion of the objective lens unit, a pair of conductor patterns, and a pair of second electrodes respectively formed at first ends of the conductor patterns. The magneto-optical head further includes a pair of conductive wires for connecting the first electrodes and the second electrodes, respectively.

10 Claims, 7 Drawing Sheets

MAGNETO-OPTICAL HEAD AND MAGNETO-OPTICAL STORAGE DEVICE

BACKGROUND OF THE INVENTION

1. Field of the Invention

The present invention relates to a magneto-optical head for data recording and/or reproduction on a magneto-optical recording medium and also to a magneto-optical storage device using this magneto-optical head.

2. Description of the Related Art

The optical head in a recent magneto-optical disk drive intended to realize size reduction is composed of a fixed optical assembly including a laser diode, a beam splitter for reflecting and transmitting a laser beam, and a photodetector for receiving reflected light from a magneto-optical disk, and a movable optical assembly including a carriage and an actuator mounted on the carriage and having an objective lens. The carriage is movable in the radial direction of the magneto-optical disk along a pair of rails by means of a voice coil motor (VCM).

A write-power laser beam emitted from the laser diode of the fixed optical assembly is first collimated by a collimator lens, next transmitted by the beam splitter, next reflected by a beam raising mirror of the actuator, and finally focused on the magneto-optical disk by the objective lens, thereby writing data onto the magneto-optical disk. On the other hand, data reading is performed by directing a read-power laser beam onto the magneto-optical disk. Reflected light from the magneto-optical disk is first collimated by the objective lens, next reflected by the beam splitter of the fixed optical assembly, and finally detected by the photodetector, thereby converting the detected magneto-optical signal into an electrical signal.

With a recent increase in amount of information covering image information inclusive of moving images, the size of a beam spot to be focused on a magneto-optical recording medium (magneto-optical disk) is required to become smaller, so as to realize high-density recording to the magneto-optical recording medium. Accordingly, the numerical aperture (NA) of the objective lens is increasing, and the operational distance of the objective lens from the magneto-optical recording medium is decreasing. Increasing the numerical aperture of a single objective lens is limited mainly because the manufacture of an aspherical single lens in the objective lens is limited. To achieve a high NA, a magneto-optical head using two lenses is disclosed in Japanese Patent Laid-open No. 2000-207797.

The magneto-optical head described in this publication is a magneto-optical head for a magneto-optical disk drive for recording by magnetic modulation, that is, a front illumination type magneto-optical head opposed directly to a recording layer of a magneto-optical disk. With respect to a glass plate on which a thin-film coil for generation of a magnetic field is formed, a first lens and a second lens are positioned in series on the side opposite to the coil forming surface. The first lens and the second lens constitute a two-component objective lens. The coil has a central opening.

A laser beam emitted from a light source such as a laser diode is first collimated by a collimator lens, next guided through a beam raising mirror to the objective lens, and next converged by the objective lens. Then, the laser beam having a fixed intensity is directed onto the magneto-optical disk. Simultaneously with this direction of the laser beam onto the magneto-optical disk, the coil formed on the glass plate is driven by a current modulated with data to be written, thereby effecting magnetic modulation to write the data onto the magneto-optical disk.

On the other hand, data reading is performed by directing a read-power laser beam onto the magneto-optical disk. Reflected light from the magneto-optical disk is first collimated by the two-component objective lens, next reflected by a beam splitter, and finally detected by a photodetector, thereby converting the detected magneto-optical signal into an electrical signal.

In the magneto-optical head described in this publication, the drive current for the coil is supplied through conductive patterns formed on both sides of a wiring member, so that the structure of current supplying means is very complicated. This complication is due to the fact that the wiring member is utilized as a heat dissipation path for dissipating the heat generated from the thin-film coil.

SUMMARY OF THE INVENTION

It is therefore an object of the present invention to provide a magneto-optical head having a simple wiring structure which can minimize any trouble such as breaking of the wiring for supplying a current to the coil.

It is another object of the present invention to provide a magneto-optical storage device having a magneto-optical head suitable for high-density recording with high reliability.

In accordance with an aspect of the present invention, there is provided a magneto-optical head including a transparent substrate having a first surface, a second surface opposite to the first surface, and a side surface formed between the first and second surfaces; a coil formed on the first surface of the transparent substrate, the coil having a first end and a second end; a pair of first electrodes provided on the side surface of the transparent substrate so as to be connected to the first and second ends of the coil, respectively; an objective lens unit provided on the second surface of the transparent substrate; a flexible printed circuit sheet provided on the second surface of the transparent substrate, the flexible printed circuit sheet having an opening for insertion of the objective lens unit, a pair of conductor patterns, and a pair of second electrodes respectively formed at first ends of the conductor patterns; and a pair of conductive wires for connecting the first electrodes and the second electrodes, respectively.

Preferably, the objective lens unit includes a lens holder mounted on the second surface of the transparent substrate, a first lens held by the lens holder, and a second lens provided on the second surface of the transparent substrate. The optical axes of the first and second lenses substantially pass through the center of the coil. Preferably, the conductive wires are welded to the first and second electrodes, respectively. For example, resistance welding is adopted as the welding of each conductive wire. Preferably, each of the conductive wires is formed of gold or copper, and each of the first electrodes is formed of nickel.

In accordance with another aspect of the present invention, there is provided an assembling method for a magneto-optical head, including the steps of preparing a transparent substrate having a first surface on which a coil having a first end and a second end is formed, a second surface opposite to the first surface, and a side surface formed between the first and second surfaces; positioning a pair of first electrodes on the side surface of the transparent substrate so that the first electrodes are connected to the first and second ends of the coil, respectively; mounting a flexible printed circuit sheet having an opening, a pair of conductor patterns, and a pair of second electrodes respectively formed at first ends of the conductor patterns, on the second surface of the transparent substrate; positioning an objective lens unit on the second surface of the transparent substrate through the opening of the flexible printed circuit sheet; and connecting a pair of conductive wires to the first electrodes and the second electrodes, respectively, by resistance welding.

Preferably, the step of connecting the conductive wires is performed in the condition where the flexible printed circuit sheet is bent to become substantially flush with the side surface of the transparent substrate. More preferably, the step of connecting the conductive wires is performed in the condition where a butting member is placed on the side surface of the transparent substrate at a position near the first surface and that one end portion of each conductive wire abuts against the butting member.

In accordance with a further aspect of the present invention, there is provided a magneto-optical storage device capable of at least reading information recorded on a magneto-optical recording medium, the magneto-optical storage device including a magneto-optical head capable of forming a beam spot on the magneto-optical recording medium and applying a magnetic field to the magneto-optical recording medium; and a photodetector for generating a reproduction signal from light reflected on the magneto-optical recording medium; the magneto-optical head including a transparent substrate having a first surface, a second surface opposite to the first surface, and a side surface formed between the first and second surfaces; a coil formed on the first surface of the transparent substrate, the coil having a first end and a second end; a pair of first electrodes provided on the side surface of the transparent substrate so as to be connected to the first and second ends of the coil, respectively; an objective lens unit provided on the second surface of the transparent substrate; a flexible printed circuit sheet provided on the second surface of the transparent substrate, the flexible printed circuit sheet having an opening for insertion of the objective lens unit, a pair of conductor patterns, and a pair of second electrodes respectively formed at first ends of the conductor patterns; and a pair of conductive wires for connecting the first electrodes and the second electrodes, respectively.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
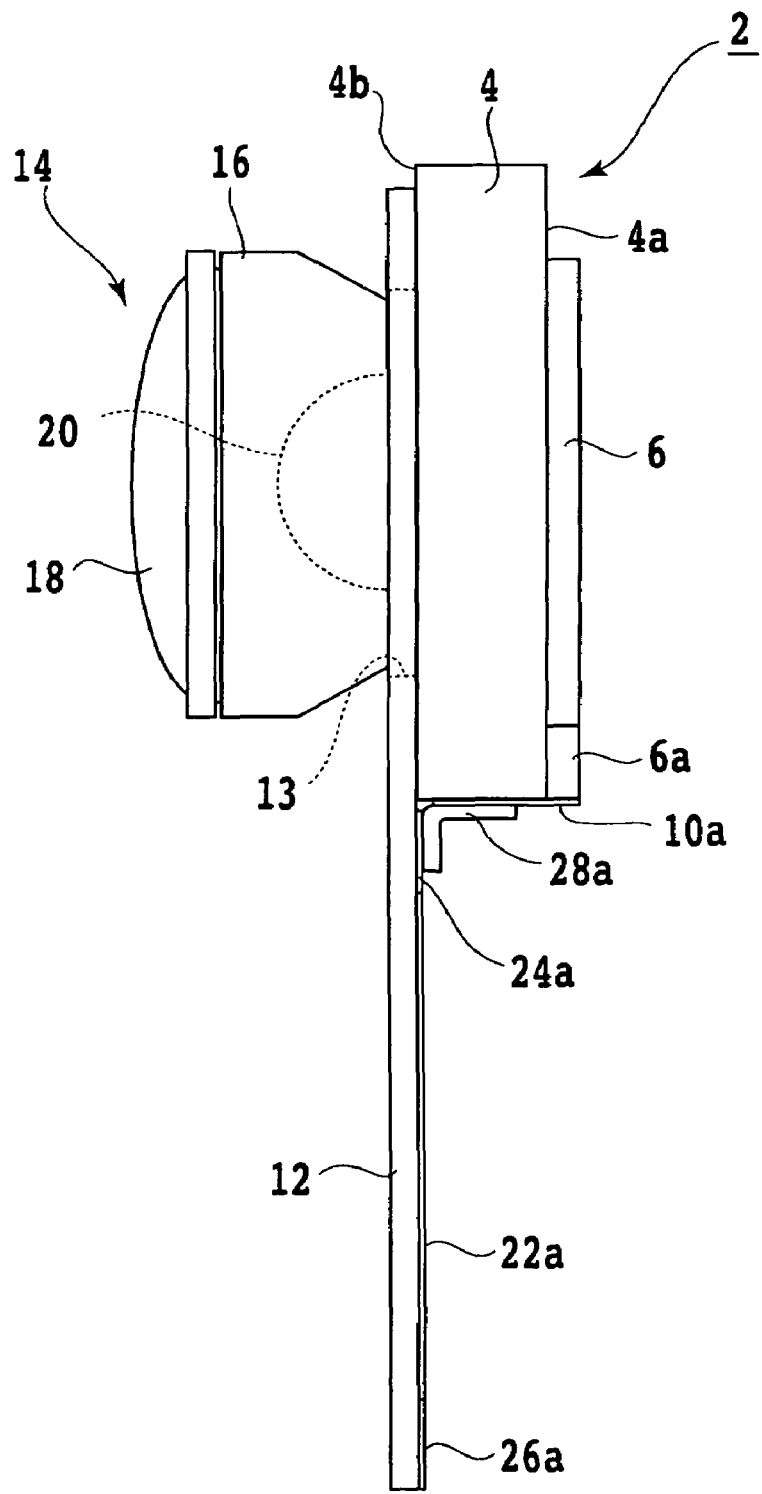
FIG. 1 is an elevational view of a magneto-optical head according to a preferred embodiment of the present invention.
Figure 2:
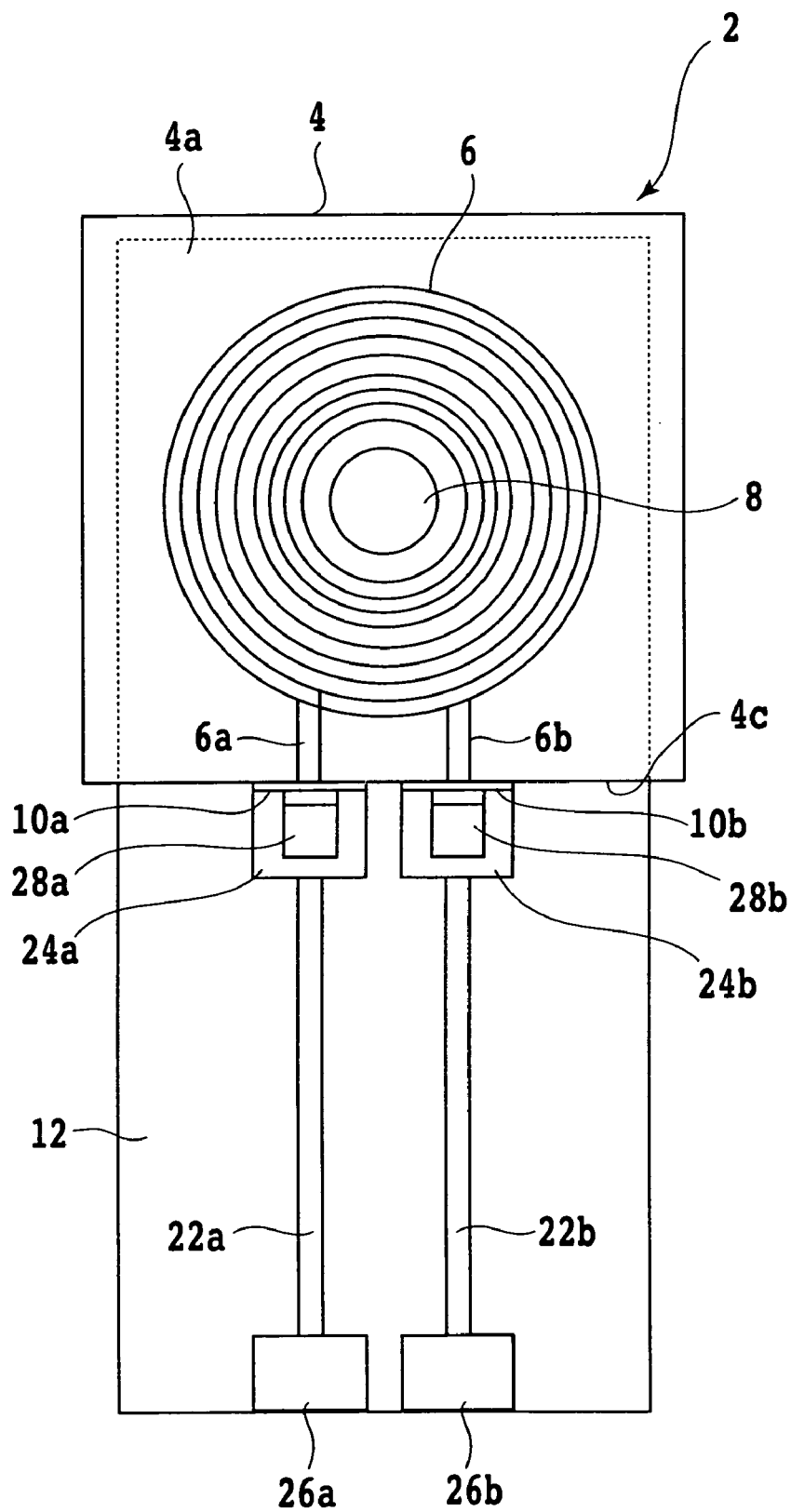
FIG. 2 is a right side view of FIG. 1.
Figure 3:
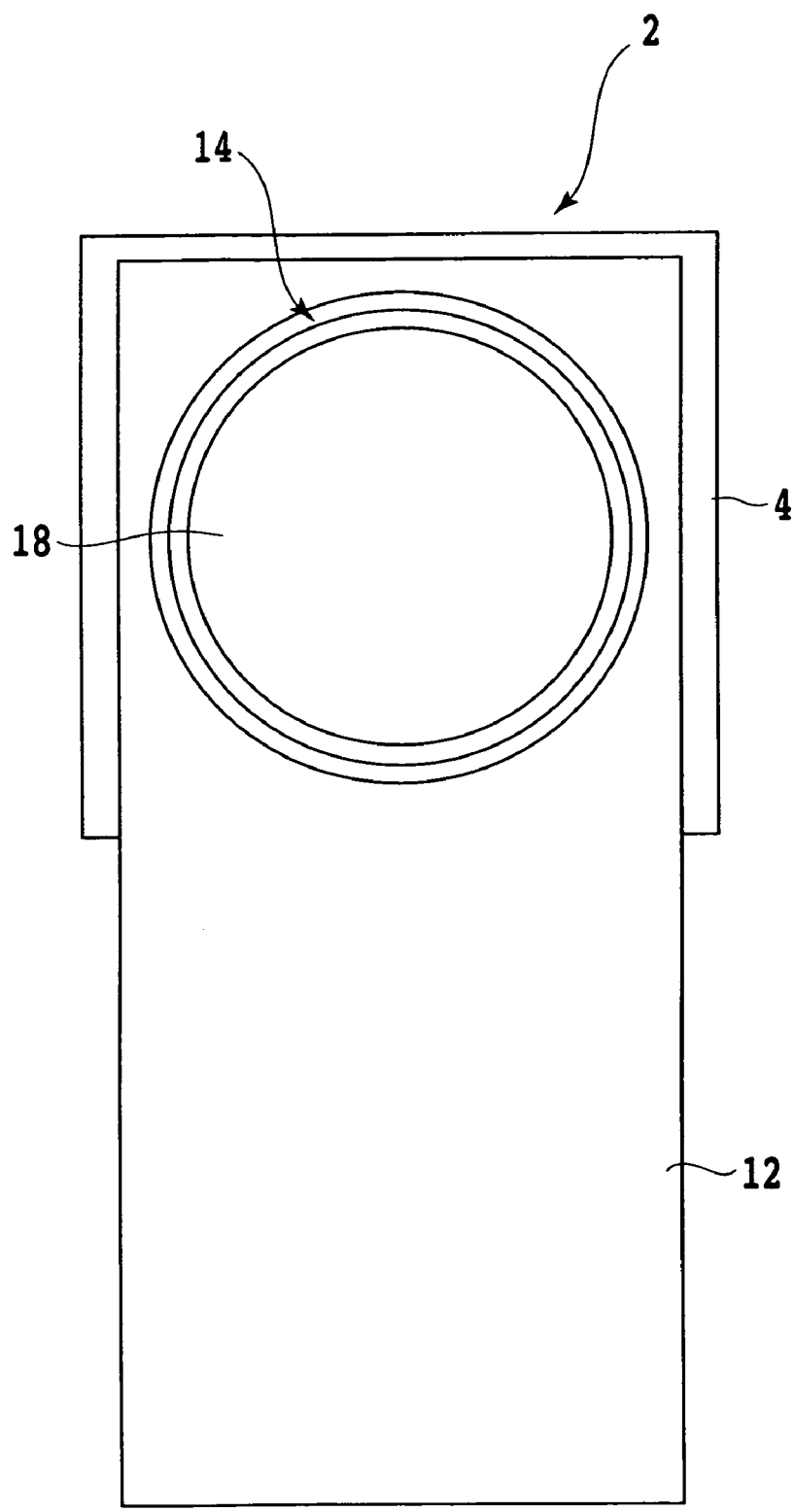
FIG. 3 is a left side view of FIG. 1.

A preferred embodiment of the present invention will now be described in detail with reference to the drawings. FIG. 1 is an elevational view of a magneto-optical head 2 according to a preferred embodiment of the present invention, FIG. 2 is a right side view of FIG. 1, and FIG. 3 is a left side view of FIG. 1. Reference numeral 4 denotes a glass plate having a shape of rectangular parallelepiped. That is, the glass plate 4 has a first surface 4a, a second surface 4b opposite to the first surface 4a and substantially parallel thereto, and a side surface 4c formed between the first surface 4a and the second surface 4b. The glass plate 4 may be replaced by a transparent substrate formed of transparent resin or the like. A thin-film coil 6 is spirally or concentrically formed on the first surface 4a of the glass substrate 4. The coil 6 is formed of copper, for example.

The coil 6 may be formed by carrying out a known thin-film forming process on the first surface 4a of the glass plate 4. The thin-film forming process includes the steps of forming a photoresist having a window opening pattern to be formed, filling the window opening pattern of the photoresist with a desired material by evaporation, sputtering, plating, etc., and removing the photoresist. As shown in FIG. 2, the coil 6 has a first end portion 6a and a second end portion 6b, and is formed with a central opening 8. A pair of coil electrodes 10a and 10b are formed on the side surface 4c of the glass plate 4, and are respectively connected to the first and second end portions 6a and 6b of the coil 6. The coil electrodes 10a and 10b are formed of nickel (Ni), for example.

A flexible printed circuit sheet (FPC sheet) 12 is bonded to the second surface 4b of the glass plate 4 by a double-sided adhesive tape or the like. The FPC sheet 12 is formed from a polyimide film, for example. As shown in FIG. 2, the FPC sheet 12 has a pair of conductor patterns 22a and 22b, a pair of FPC electrodes 24a and 24b respectively connected to the conductor patterns 22a and 22b at first ends thereof, and a pair of terminals 26a and 26b respectively connected to the conductor patterns 22a and 22b at second ends thereof.

The conductor patterns 22a and 22b, the FPC electrodes 24a and 24b, and the terminals 26a and 26b are formed of copper (Cu), for example. The coil electrode 10a and the FPC electrode 24a are connected by a conductive wire 28a formed from a gold ribbon or the like. Similarly, the coil electrode 10b and the FPC electrode 24b are connected by a conductive wire 28b formed from a gold ribbon or the like. The gold ribbon may be replaced by a copper wire as each conductive wire. The FPC sheet 12 has a circular opening 13 through which an objective lens unit 14 is placed and bonded to the second surface 4b of the glass plate 4.

The objective lens unit 14 includes a lens holder 16 bonded to the second surface 4b of the glass plate 4, a first lens 18 bonded to the lens holder 16 and held thereto, and a second lens 20 bonded to the second surface 4b of the glass plate 4 by means of an optical adhesive. The second lens 20 may be integrated with the glass plate 4. More generally, the second lens 20 may be integrated with a transparent substrate of resin or glass. The objective lens unit 14 is bonded to the second surface 4b of the glass plate 4 so that the optical axes of the first and second lenses 18 and 20 substantially coincide with each other and these optical axes substantially pass through the center of the coil 6.

A connection method for the coil electrodes 10a and 10b and the FPC electrodes 24a and 24b will now be described in detail with reference to FIGS. 4 and 5. In general, soldering is used as a method of fixing a conductive wire to an electrode. However, there is a problem in heat resistance of the thin-film coil 6 and the adhesive for bonding the objective lens unit 14 to the glass plate 4 at a solder melting point. Further, in the case of soldering, there is a possibility that fine solder balls may adhere to the coil surface. These problems have been solved by adopting resistance welding for connection of each conductive wire and the corresponding electrodes.

Figure 4:
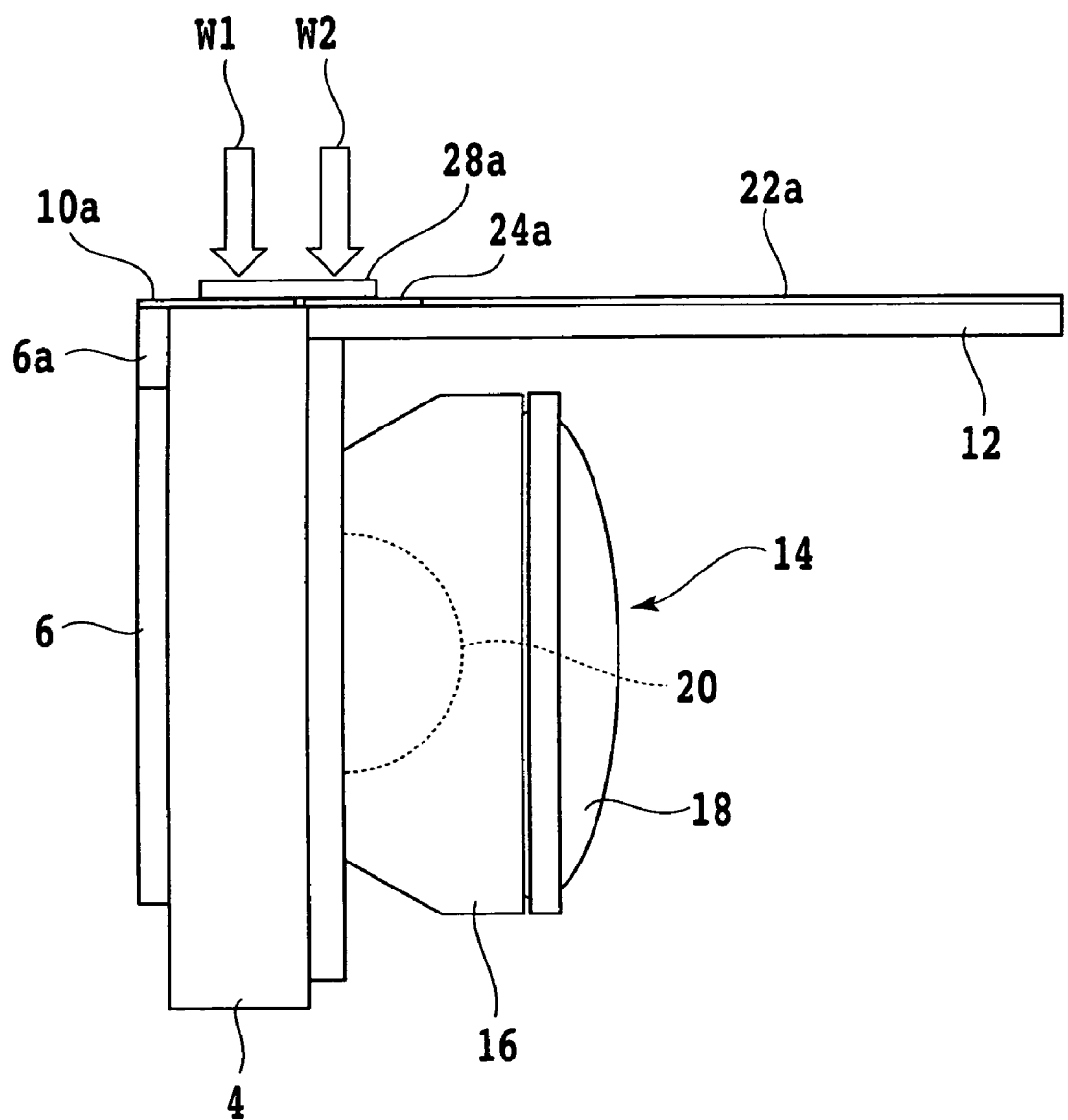
FIG. 4 is an elevational view for illustrating a connection method for a conductive wire.

As shown in FIG. 4, the FPC sheet 12 is bent about 90° so that the coil electrodes 10a and 10b become substantially flush with the FPC electrodes 24a and 24b, respectively. In this condition, the conductive wire 28a such as a gold ribbon is resistance-welded to the coil electrode 10a and the FPC electrode 24a respectively at two positions W1 and W2. Similarly, the conductive wire 28b such as a gold ribbon is resistance-welded to the coil electrode 10b and the FPC electrode 24b. This resistance welding may be performed by using any commercially available resistance welding device such as a resistance welding device for fine connection manufactured by HiSOL Inc.

Figure 5:
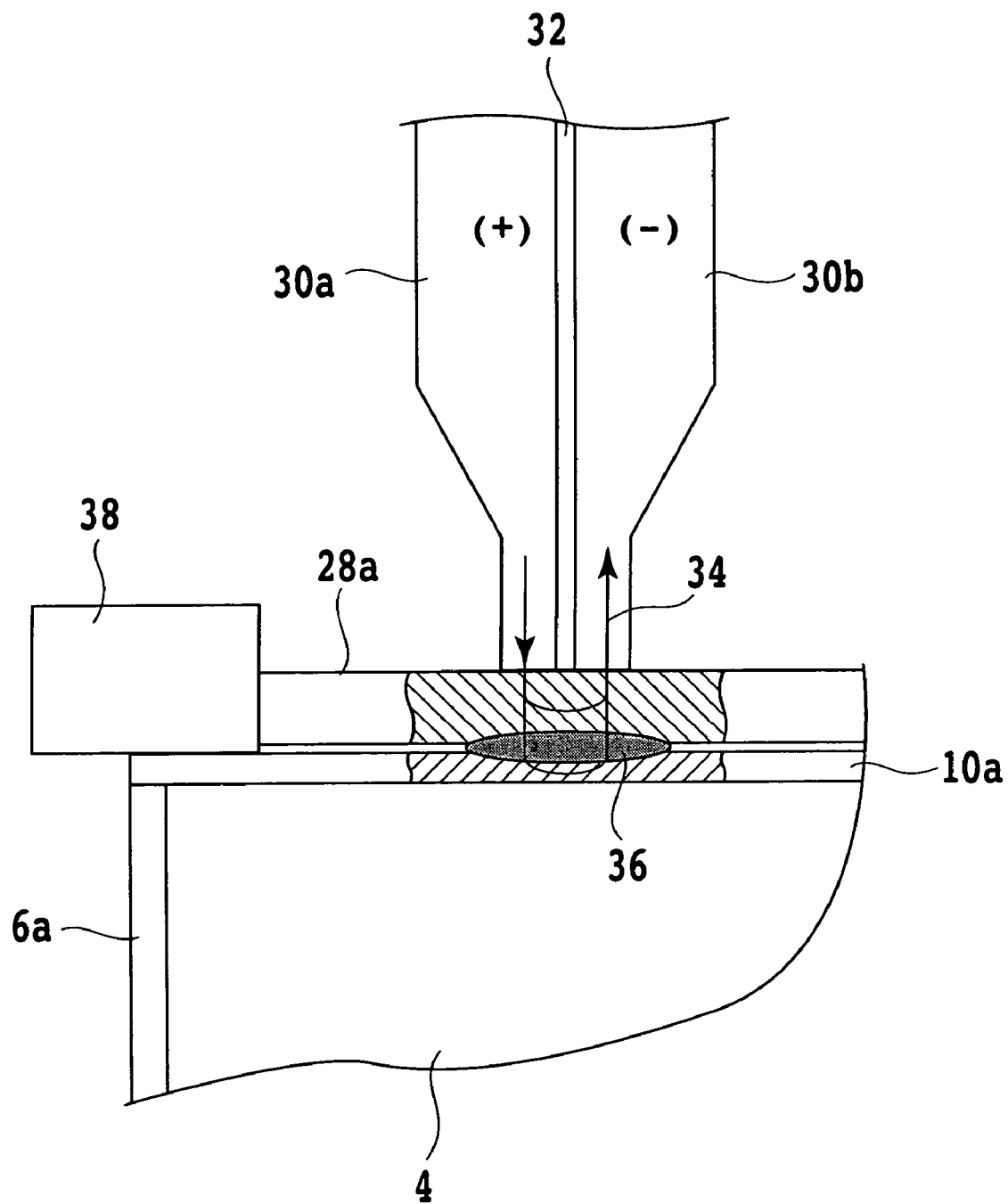
FIG. 5 is a partially sectional view for illustrating a resistance welding method.

As shown in FIG. 5, this resistance welding device has a pair of welding electrodes 30a and 30b insulated from each other by an electrode insulating member 32. The conductive wire 28a is pressed on the coil electrode 10a at a given pressure by the welding electrodes 30a and 30b, and simultaneously the welding electrodes 30a and 30b are connected to a power supply (not shown). As a result, a welding current flows as shown by an arrow 34 in FIG. 5, and heat is generated at a contact portion between the conductive wire 28a and the coil electrode 10a. By using this heat, the conductive wire 28a and the coil electrode 10a can be welded together. Reference numeral 36 denotes a welded portion by this resistance welding.

If the end portions of the conductive wires 28a and 28b project from the coil surface of the glass plate 4 on which the coil 6 is formed in fixing the conductive wires 28a and 28b to the coil electrodes 10a and 10b, there is a possibility that the projecting end portions of the conductive wires 28a and 28b may come into contact with a magneto-optical disk surface in using the magneto-optical head of the present invention, causing a damage to the magneto-optical disk surface. In the conductive wire connection method according to the present invention, a butting member 38 for preventing the projection of the end portion of the conductive wire 28a from the coil surface of the glass plate 4 on which the coil 6 is formed is used in positioning the conductive wire 28a on the coil electrode 10a formed on the glass plate 4 as shown in FIG. 5. In the condition where the conductive wire 28a abuts against the butting member 38, the resistance welding of the conductive wire 28a to the coil electrode 10a is performed to thereby prevent the projection of the end portion of the conductive wire 28a from the coil surface.

By adopting resistance welding for the connection of the conductive wire to the coil electrode and the FPC electrode in this preferred embodiment, the following effects can be obtained. Thermal damage to the thin-film coil 6 due to a local temperature rise or the like can be prevented. No coating on the nickel base forming the coil electrodes 10a and 10b is required (in the case of soldering, Au or Cu coating is required), so that the connection can be made at a low cost. The welding is performed in a clean condition and there is no possibility of contamination of the surroundings (in the case of soldering, fine solder balls may possibly stick to the coil surface). In the magneto-optical head 2 according to this preferred embodiment, the glass plate 4 can be supported mainly by the FPC sheet 12 in connecting the conductive wires 28a and 28b to the coil electrodes 10a and 10b formed on the glass plate 4 and to the FPC electrodes 24a and 24b, respectively. Accordingly, breaking of the conductive wires 28a and 28b can be prevented.

Figure 6:
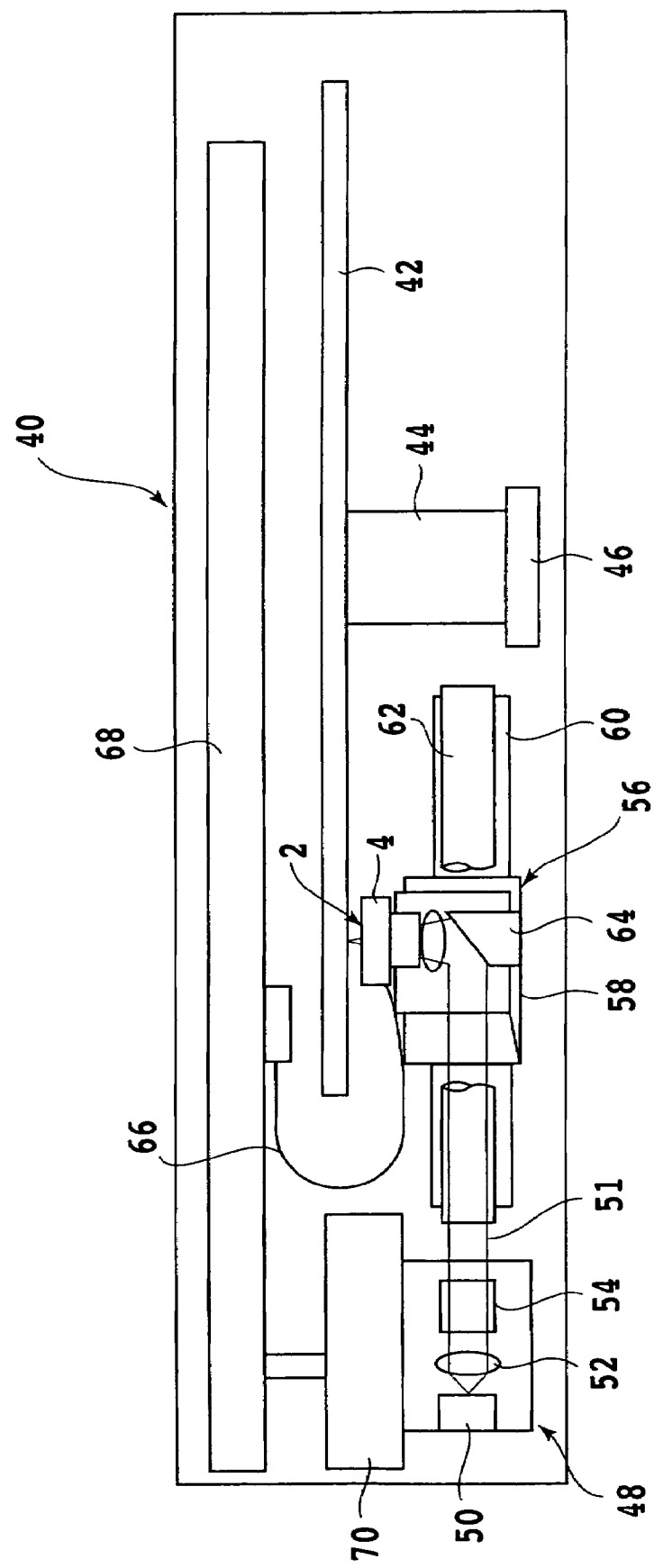
FIG. 6 is a schematic illustration of a magneto-optical disk drive adopting the magneto-optical head according to the present invention.

Referring next to FIG. 6, there is schematically shown a magneto-optical disk drive 40 including the magneto-optical head according to the present invention. The configuration of the magneto-optical disk drive 40 will now be described in brief. A magneto-optical disk 42 is removably mounted on a spindle 44 rotated by a spindle motor 46. Reference numeral 48 denotes a fixed optical assembly, which includes a laser diode 50, a collimator lens 52 for collimating a laser beam emitted from the laser diode 50, a polarization beam splitter 54, and photodetectors for a magneto-optical signal and servo (not shown).

Reference numeral 56 denotes a movable optical assembly, which includes a carriage 58, a magneto-optical head 2 mounted on the carriage 58, and a beam raising mirror 64 mounted on the carriage 58. The carriage 58 is moved in the radial direction of the magneto-optical disk 42 along a pair of rails (one of which being shown) 62 by a voice coil motor (VCM) composed of a magnet 60 and a coil (not shown) mounted on the carriage 58. Although not shown, the carriage 58 has a focus actuator for driving the magneto-optical head 2 in the focusing direction of the objective lens unit 14.

In the magneto-optical disk drive of this preferred embodiment, the above-mentioned VCM serves also as a track actuator. A flexible printed circuit sheet (FPC sheet) 66 is provided to connect the terminals 26a and 26b of the FPC sheet 12 to a printed wiring board 68 on which a control circuit is formed. The FPC sheet 66 supplies a drive current to the coil 6 and the focus actuator. Reference numeral 70 denotes a head amplifier for controlling a drive current to be supplied to the laser diode 50 and amplifying an MO signal or a servo signal detected by each photodetector.

Figure 7:
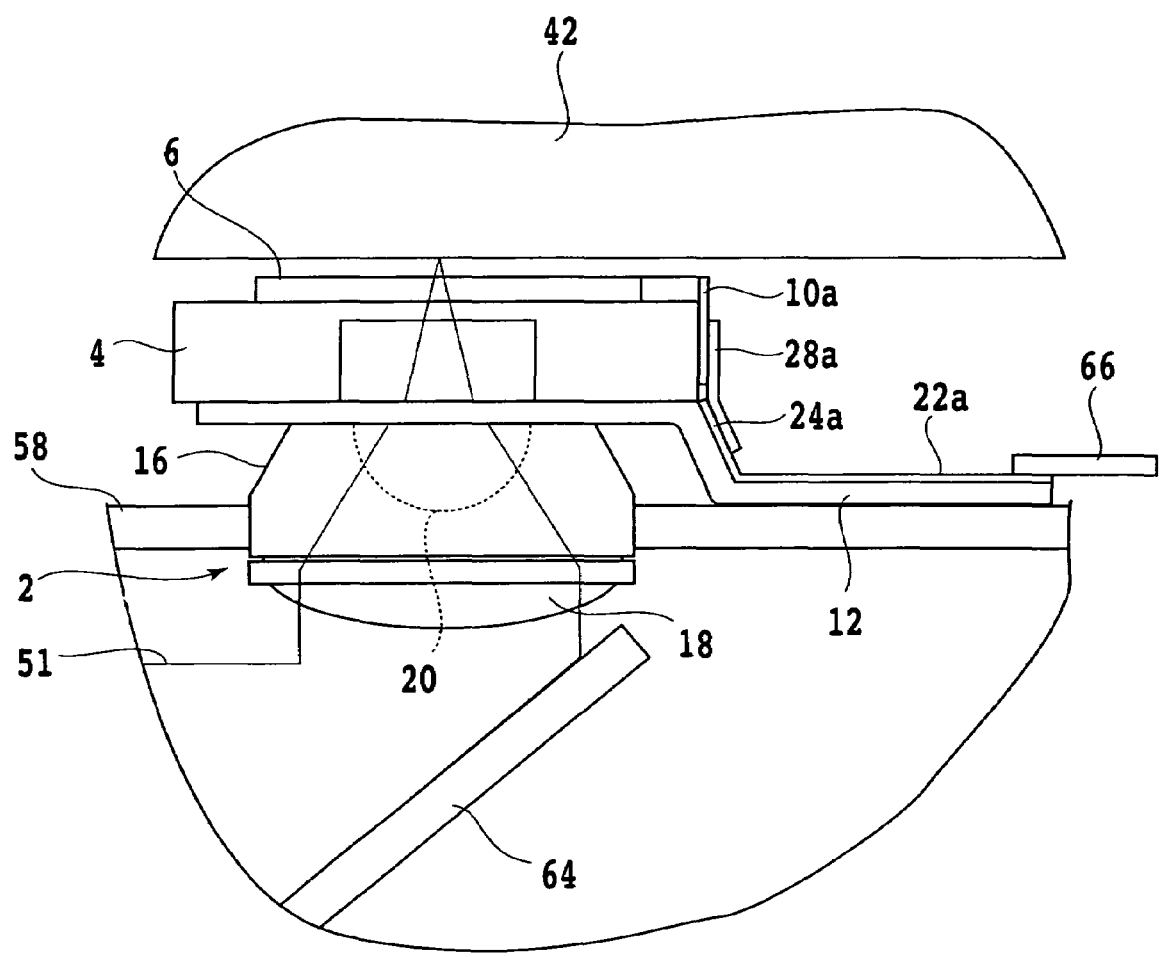
FIG. 7 is an enlarged view of a magneto-optical head and its peripheral portion in the magneto-optical disk drive shown in FIG. 6.

FIG. 7 is an enlarged view of the magneto-optical head 2 and its peripheral portion in the magneto-optical disk drive 40 shown in FIG. 6. The FPC sheet 12 is bent twice at different positions as shown in FIG. 7 after the conductive wire 28a is resistance-welded to the coil electrode 10a and the FPC electrode 24a in the condition shown in FIG. 4. Such bending of the FPC sheet 12 shown in FIG. 7 is very easy because the FPC sheet 12 has flexibility.

In writing data, a write-power laser beam emitted from the laser diode 50 of the fixed optical assembly 48 is first collimated by the collimator lens 52, next transmitted by the polarization beam splitter 54, next reflected by the beam raising mirror 64 of the movable optical assembly 56, and finally focused on the magneto-optical disk 42 by the objective lens unit 14 of the magneto-optical head 2. At the same time, a drive current modulated with data to be written is supplied to the coil 6 of the magneto-optical head 2, thereby effecting magnetic modulation to write the data onto the magneto-optical disk 42 at a position irradiated with the beam spot.

On the other hand, data reading is performed by directing a read-power laser beam onto the magneto-optical disk 42. Reflected light from the magneto-optical disk 42 is first collimated by the objective lens unit 14, next reflected by the polarization beam splitter 54 of the fixed optical assembly 48, and finally detected by the photodetector, thereby converting the detected magneto-optical signal into an electrical signal.

According to the magneto-optical head of the present invention as described above, the coil formed on one surface of the transparent substrate and the conductor pattern formed on the FPC sheet for supporting the transparent substrate can be connected by a simple structure, so that it is possible to provide a magneto-optical head which is less expensive and has high reliability. Further, in connecting the coil electrode and the FPC electrode through the conductive wire, the transparent substrate can be supported mainly by the FPC sheet, so that breaking of the conductive wire can be prevented.

What is claimed is:

1. A magneto-optical head comprising:
   a transparent substrate having a first surface, a second surface opposite to said first surface, and a side surface formed between said first and second surfaces;
   a coil formed on said first surface of said transparent substrate, said coil having a first end and a second end;
   a pair of first electrodes provided on said side surface of said transparent substrate so as to be connected to said first and second ends of said coil, respectively;
   an objective lens unit provided on said second surface of said transparent substrate;
   a flexible printed circuit sheet provided on said second surface of said transparent substrate, said flexible printed circuit sheet having an opening for insertion of said objective lens unit, a pair of conductor patterns, and a pair of second electrodes respectively formed at first ends of said conductor patterns; and
   a pair of conductive wires for connecting said first electrodes and said second electrodes, respectively.

2. A magneto-optical head according to claim 1, wherein said objective lens unit comprises a lens holder mounted on said second surface of said transparent substrate, a first lens held by said lens holder, and a second lens provided on said second surface of said transparent substrate.

3. A magneto-optical head according to claim 2, wherein the optical axes of said first and second lenses substantially pass through the center of said coil.

4. A magneto-optical head according to claim 1, wherein said conductive wires are welded to said first and second electrodes, respectively.

5. A magneto-optical head according to claim 4, wherein each of said conductive wires is formed of gold or copper.

6. A magneto-optical head according to claim 1, wherein each of said first electrodes is formed of nickel.

7. An assembling method for a magneto-optical head, comprising the steps of:
   preparing a transparent substrate having a first surface on which a coil having a first end and a second end is formed, a second surface opposite to said first surface, and a side surface formed between said first and second surfaces;
   positioning a pair of first electrodes on said side surface of said transparent substrate so that said first electrodes are connected to said first and second ends of said coil, respectively;
   mounting a flexible printed circuit sheet having an opening, a pair of conductor patterns, and a pair of second electrodes respectively formed at first ends of said conductor patterns, on said second surface of said transparent substrate;
   positioning an objective lens unit on said second surface of said transparent substrate through said opening of said flexible printed circuit sheet; and
   connecting a pair of conductive wires to said first electrodes and said second electrodes, respectively, by resistance welding.

8. An assembling method according to claim 7, wherein said step of connecting said conductive wires is performed in the condition where said flexible printed circuit sheet is bent to become substantially flush with said side surface of said transparent substrate.

9. An assembling method according to claim 8, wherein said step of connecting said conductive wires is performed in the condition where a butting member is placed on said side surface of said transparent substrate at a position near said first surface and that one end portion of each conductive wire abuts against said butting member.

10. A magneto-optical storage device capable of at least reading information recorded on a magneto-optical recording medium, said magneto-optical storage device comprising:
    a magneto-optical head capable of forming a beam spot on said magneto-optical recording medium and applying a magnetic field to said magneto-optical recording medium; and
    a photodetector for generating a reproduction signal from light reflected on said magneto-optical recording medium;
    said magneto-optical head comprising:
    a transparent substrate having a first surface, a second surface opposite to said first surface, and a side surface formed between said first and second surfaces;
    a coil formed on said first surface of said transparent substrate, said coil having a first end and a second end;
    a pair of first electrodes provided on said side surface of said transparent substrate so as to be connected to said first and second ends of said coil, respectively;
    an objective lens unit provided on said second surface of said transparent substrate;
    a flexible printed circuit sheet provided on said second surface of said transparent substrate, said flexible printed circuit sheet having an opening for insertion of said objective lens unit, a pair of conductor patterns, and a pair of second electrodes respectively formed at first ends of said conductor patterns; and
    a pair of conductive wires for connecting said first electrodes and said second electrodes, respectively.

* * * * *